(12) United States Patent
Huang et al.

(10) Patent No.: US 10,418,264 B2
(45) Date of Patent: Sep. 17, 2019

(54) ASSEMBLING DEVICE USED FOR SEMICONDUCTOR EQUIPMENT

(71) Applicant: HERMES-EPITEK CORPORATION, Taipei (TW)

(72) Inventors: Tsan-Hua Huang, Tainan (TW); Paul Wong, Johor (MY)

(73) Assignee: Hermes-Epitek Corporation, Taipei (TW)

( * ) Notice: Subject to any disclaimer, the term of this patent is extended or adjusted under 35 U.S.C. 154(b) by 254 days.

(21) Appl. No.: 15/647,639

(22) Filed: Jul. 12, 2017

(65) Prior Publication Data

US 2017/0358473 A1    Dec. 14, 2017

Related U.S. Application Data

(63) Continuation-in-part of application No. 15/608,057, filed on May 30, 2017.

(30) Foreign Application Priority Data

Jun. 8, 2016 (TW) .............................. 105118226 A

(51) Int. Cl.
*H01L 21/677* (2006.01)
*H01L 21/683* (2006.01)
*H01L 21/67* (2006.01)

(52) U.S. Cl.
CPC .... *H01L 21/67772* (2013.01); *H01L 21/6719* (2013.01); *H01L 21/67126* (2013.01); *H01L 21/67207* (2013.01); *H01L 21/67742* (2013.01); *H01L 21/67766* (2013.01); *H01L 21/683* (2013.01)

(58) Field of Classification Search
CPC .......... H01L 21/67126; H01L 21/6719; H01L 21/67207; H01L 21/67742; H01L 21/67766; H01L 21/67772; H01L 21/683
See application file for complete search history.

(56) References Cited

U.S. PATENT DOCUMENTS

| | | | |
|---|---|---|---|
| 2008/0179006 A1* | 7/2008 | Tahara | C23C 16/401 156/345.29 |
| 2011/0200321 A1* | 8/2011 | Takiguchi | G03B 27/52 396/577 |
| 2013/0316516 A1* | 11/2013 | Deguchi | H01L 21/67121 438/455 |
| 2015/0251398 A1* | 9/2015 | Deguchi | B32B 37/1284 156/281 |
| 2017/0133328 A1* | 5/2017 | Ranish | H01J 37/32009 |
| 2017/0358463 A1* | 12/2017 | Huang | H01L 21/67005 |

* cited by examiner

*Primary Examiner* — Marc Carlson
(74) *Attorney, Agent, or Firm* — Donald E. Stout; Stout, Uxa & Buyan, LLP

(57) ABSTRACT

The present invention is directed to an assembling device used for semiconductor equipment. The assembling device includes a chamber lid, a ceiling, a suspension part, a driving part and receptacles. The ceiling is disposed below the chamber lid. The suspension part is inserted through the chamber lid, and to be hooked to the ceiling. The driving part is disposed above the chamber lid and connected to the suspension part, and configured to drive the suspension part to join or separate the ceiling and the chamber lid. The receptacles are disposed in the ceiling and configured to be correspondingly attached to the suspension part, each of the receptacles defines a rotating groove that is open at top and closed at bottom.

20 Claims, 17 Drawing Sheets

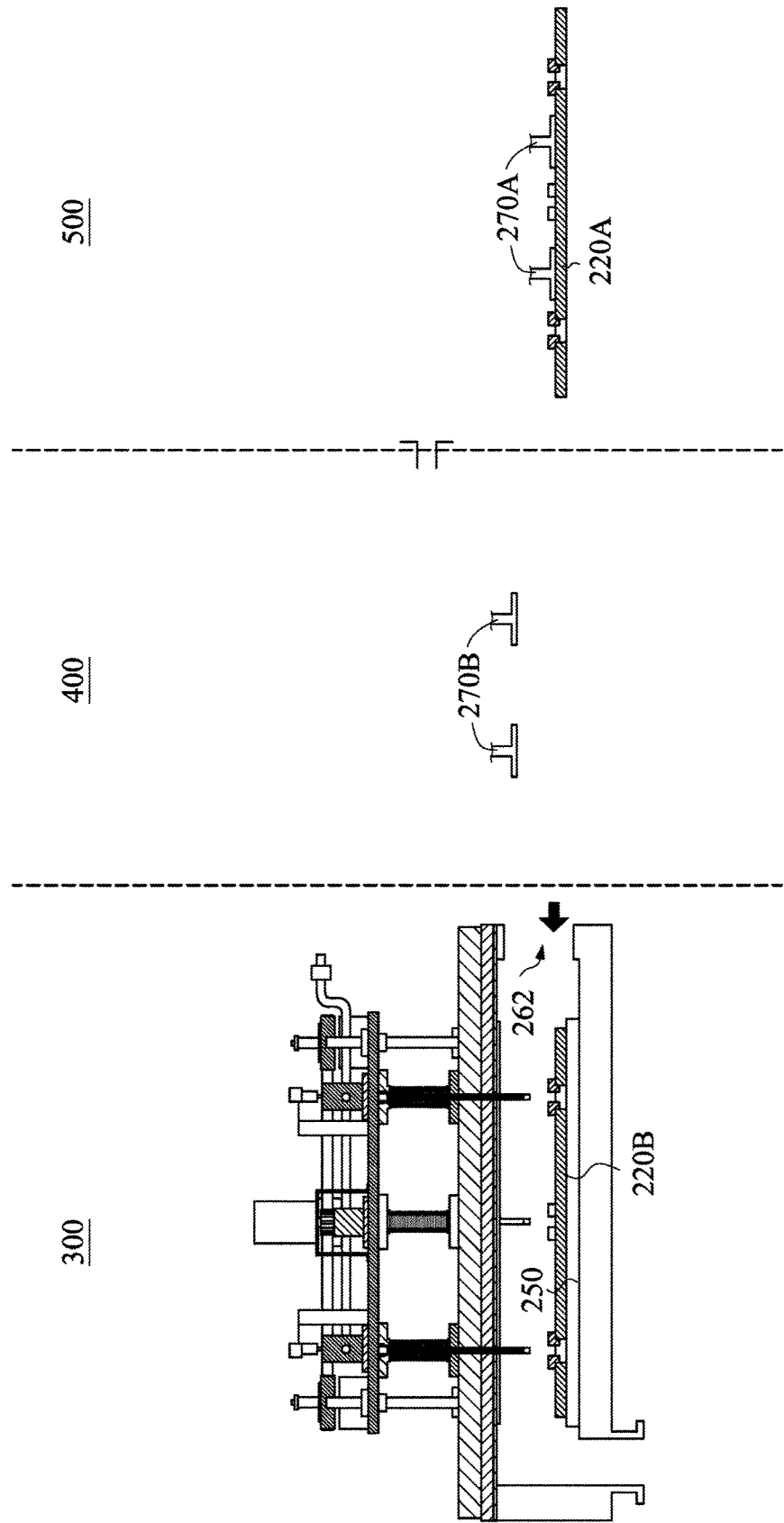

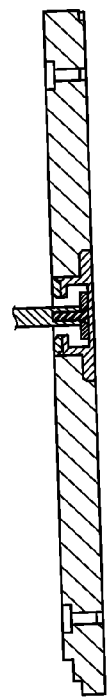
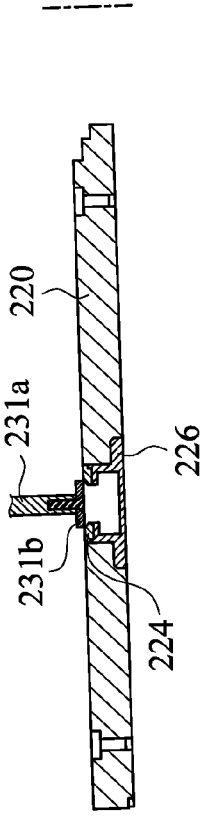
FIG. 7A
FIG. 7B

ASSEMBLING DEVICE USED FOR SEMICONDUCTOR EQUIPMENT

CROSS-REFERENCE TO RELATED APPLICATIONS

This application is a continuation-in-part (CIP) of U.S. application Ser. No. 15/608,057, filed on May 30, 2017 and entitled ASSEMBLING DEVICE USED FOR SEMICONDUCTOR EQUIPMENT, which in turn claims priority from Taiwan Patent Application No. 105118226, filed on Jun. 8, 2016. The entire contents of each of the foregoing applications are herein expressly incorporated by reference.

BACKGROUND OF THE INVENTION

1. Field of the Invention

The present invention generally relates to an assembling device, and more particularly to an automatic assembling device adaptable to semiconductor equipment.

2. Description of Related Art

In a film deposition process, a wafer supported on a susceptor in a chamber is exposed to reactant gases that are injected and heated to react or decompose on the wafer to produce a thin film.

A ceiling opposite the susceptor is commonly adopted for guiding flow and controlling temperature. The purpose of guiding flow is to mitigate turbulence and to guide the turbulence out of a growth zone; and the purpose of controlling temperature is to prevent a by-product (e.g., unwanted particles) from adhering to the surface of the ceiling. The by-product on a ceiling with temperature improperly controlled may probably fall onto the wafer. To the contrary, a by-product has less chance of adhering to or falling from the ceiling with temperature properly controlled, thereby enhancing yield of processed wafers.

FIG. 1A and FIG. 1B respectively show a perspective view and a side view of arrangement of a ceiling 110 and a chamber lid 120 for conventional semiconductor equipment 100. The ceiling 110 is manually attached to the chamber lid 120. Specifically, a center fastener 130 of the ceiling 110 is screwed to a center tapped hole of the chamber lid 120. A spacer ring 140 is commonly disposed between the edge of the ceiling 110 and the chamber lid 120 to result in a gap, which needs to be adjusted to control chamber temperature according to composition and flow of reactant gases. Thickness of the spacer ring 140 determines the gap between the ceiling 110 and the chamber lid 120.

However, at least two operators are required to firmly attach the ceiling 10 to the chamber lid 120. Likewise, at least two operators are required to manually unload the ceiling 110 for cleaning. Substantial manpower is thus demanded for loading or unloading the ceiling 110. Further, the ceiling 110 may not be securely attached to the chamber lid 120 as only the center fastener 130 is responsible for supporting the ceiling 110.

A need has thus arisen to propose an automatic assembling device used for semiconductor equipment to increase efficiency and convenience of loading and unloading the ceiling.

SUMMARY OF THE INVENTION

In view of the foregoing, it is an object of the embodiment of the present invention to provide an automatic assembling device used for semiconductor equipment in order to reduce complexity and labor cost, and to increase use efficiency and convenience effectively. In one embodiment, the assembling device can prevent particles deposited on a suspension part. In another embodiment, the assembling device can provide for stable linear movement and/or stable rotation of the suspension part.

According to one embodiment, an assembling device used for semiconductor equipment includes a chamber lid, a ceiling, a suspension part and a driving part. The ceiling is disposed below the chamber lid. The suspension part is inserted through the chamber lid and to be hooked to the ceiling. The driving part is disposed above the chamber lid and connected to the suspension part. The driving part is configured to drive the suspension part to join or separate the ceiling and the chamber lid. The driving part includes an elevating unit and a rotating unit. The elevating unit is configured to elevate the suspension part, and the rotating unit is configured to rotate the suspension part.

According to a further embodiment, an assembling device used for semiconductor equipment includes a chamber lid, a ceiling, a suspension part, a driving part and receptacles. The ceiling is disposed below the chamber lid. The suspension part is inserted through the chamber lid and to be hooked to the ceiling. The driving part is disposed above the chamber lid and connected to the suspension part. The driving part is configured to drive the suspension part to join or separate the ceiling and the chamber lid. The receptacles are disposed in the ceiling and configured to be correspondingly attached to the suspension part, each of the receptacles defines a rotating groove that is open at top and closed at bottom.

BRIEF DESCRIPTION OF THE DRAWINGS

FIG. 3C and FIG. 3D show cross-sectional views of the assembling device adaptable to semiconductor equipment for automatically replacing the ceiling according to another embodiment of the present invention;

FIG. 7A and FIG. 7B show simplified cross-sectional views illustrated of tilted receptacles and corresponding suspension elements of FIG. 4.

DETAILED DESCRIPTION OF THE INVENTION

Figure 1A:
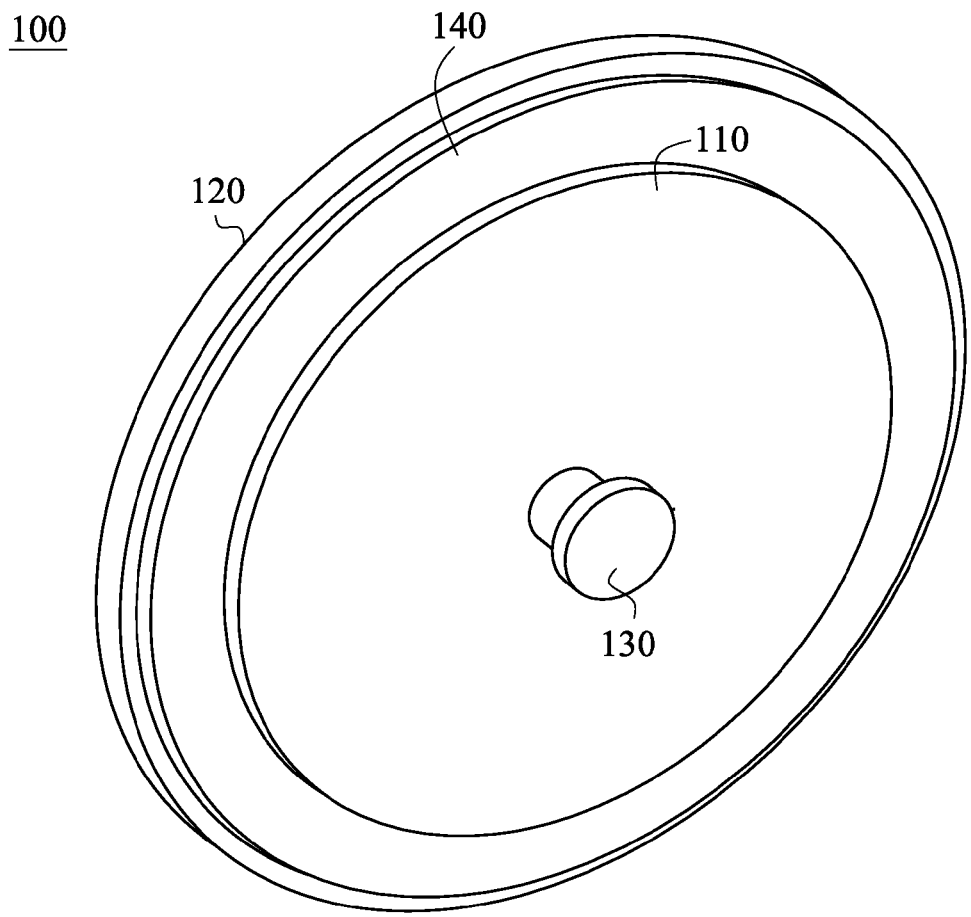
FIG. 1A and FIG. 1B respectively show a perspective view and a side view of arrangement of a ceiling and a chamber lid for conventional semiconductor equipment.
Figure 1B:
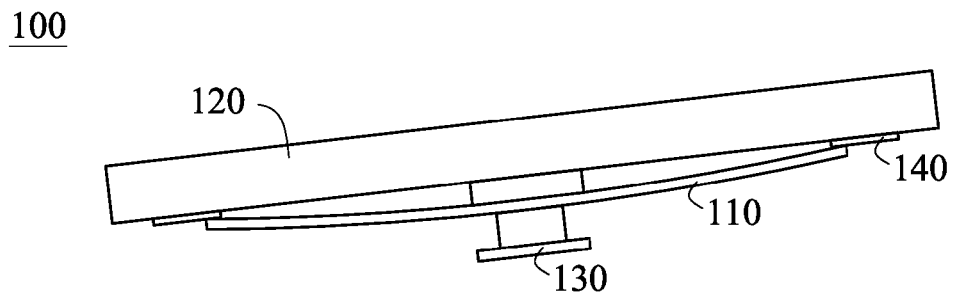
Figure 2A:
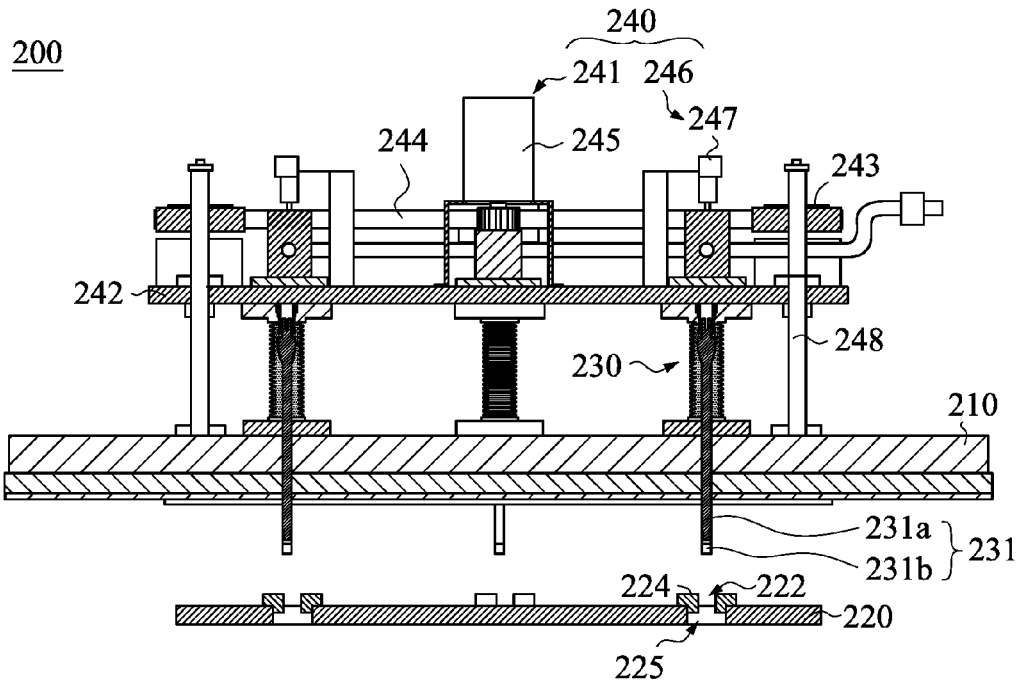
FIG. 2A and FIG. 2B show cross-sectional views of an assembling device adaptable to semiconductor equipment for assembling a ceiling and a chamber lid according to one embodiment of the present invention.
Figure 2B:
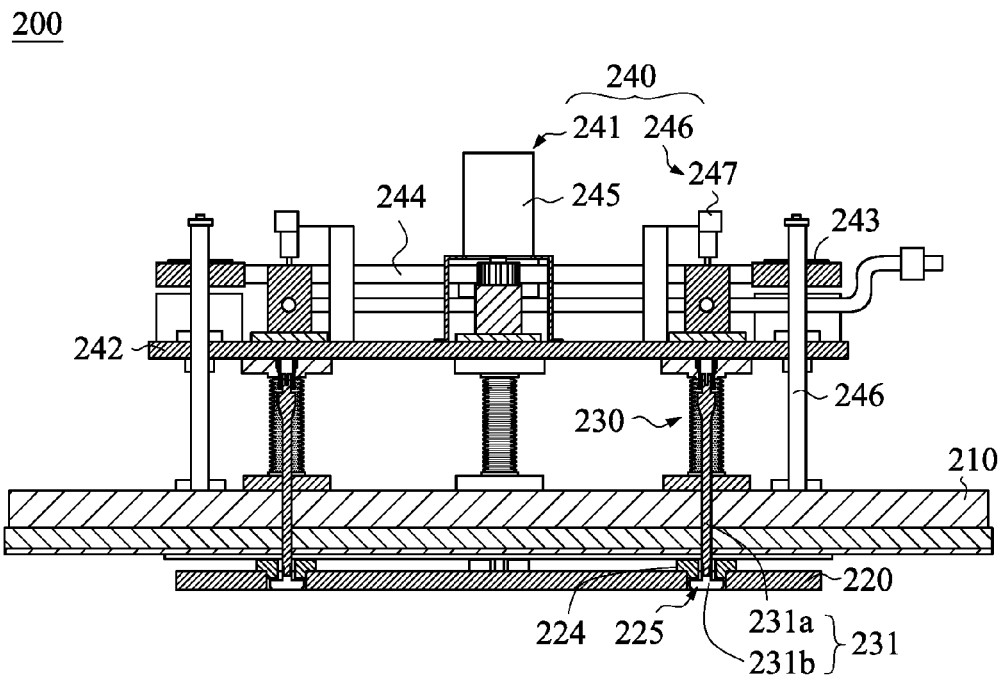

FIG. 2A and FIG. 2B show cross-sectional views of an assembling device 200 adaptable to semiconductor equipment for assembling a ceiling 220 and a chamber lid 210 according to one embodiment of the present invention. The assembling device 200 used for semiconductor equipment may include a chamber lid 210, a ceiling 220, a suspension part 230 and a driving part 240. The ceiling 220 is disposed below the chamber lid 210. The suspension part 230 is inserted through the chamber lid 210 and to be hooked to the ceiling 220. The driving part 240 is disposed above the chamber lid 210 and connected to the suspension part 230, and the driving part 240 is configured to drive the suspension part 230 to join or separate the ceiling 220 and the chamber lid 210.

Specifically, the driving part 240 may include an elevating unit 241 and a rotating unit 246. The elevating unit 241 is configured to elevate (i.e., raise or lower) the suspension part 230, and the rotating unit 246 is configured to rotate the suspension part 230.

To be more elaborate, the driving part 240 drives the suspension part 230 to join the ceiling 220 and the chamber lid 210. Specifically, the elevating unit 241 lowers the suspension part 230 and inserts it to the ceiling 220. The rotating unit 246 then rotates the suspension part 230 and hooks it to the ceiling 220. Subsequently, when the elevating unit 241 raises the suspension part 230, the suspension part 230 accordingly raises the ceiling 220 and fastens it to a bottom surface of the chamber lid 210.

In the embodiment, the suspension part 230 may include a plurality of first suspension elements 231 disposed above the ceiling 220. Each first suspension element 231 may include a first support rod 231a and a first hook 231b which is disposed at a bottom end of the first support rod 231a. In one embodiment, the first hook 231b is a T-shaped hook with a top end connected to the bottom end of the first support rod 231a and a bottom end facing toward the ceiling 220.

Figure 2C:
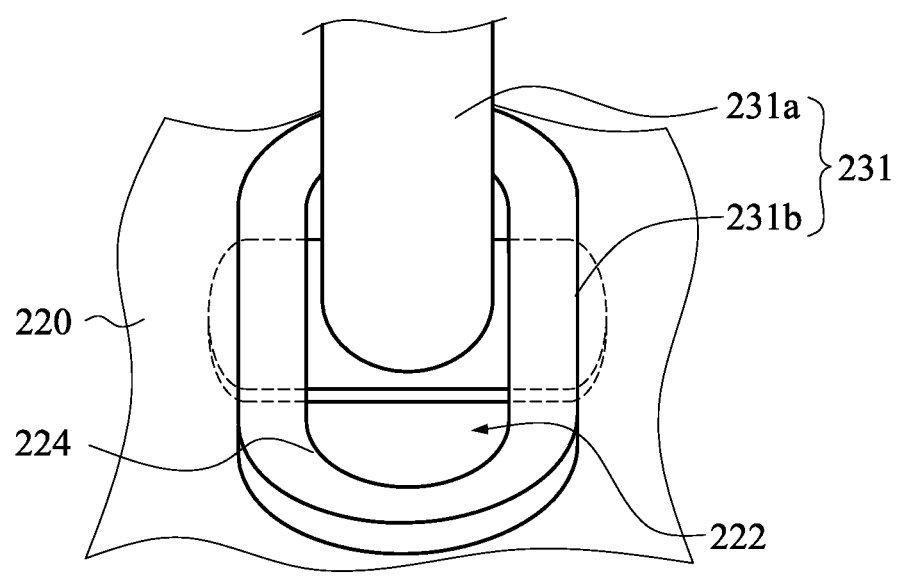
FIG. 2C shows a partial perspective view of the ceiling and the suspension part of the assembling device of FIGS. 2A-2B.

FIG. 2C shows a partial perspective view of the ceiling 220 and the suspension part 230 of the assembling device 200 of FIGS. 2A-2B. In the embodiment, the ceiling 220 has a plurality of openings 222 disposed corresponding to the first suspension elements 231, respectively. The driving part 240 drives the suspension part 230 to join the ceiling 220 and the chamber lid 210 by the T-shaped first hook 231b and the opening 222 of the ceiling 220. Specifically, the elevating unit 241 lowers the first support rod 231a and inserts it to the opening 222. The rotating unit 246 then rotates the first support rod 231a and hooks the first hook 231b to the ceiling 220. Subsequently, when the elevating unit 241 raises the first support rod 231a, the first hook 231b accordingly raises the ceiling 220 and fastens it to the bottom surface of the chamber lid 210.

Each opening 222 of the ceiling 220 may have a corresponding rotating groove 225. When the rotating unit 246 rotates the first support rod 231a, the first hook 231b accordingly rotates in the rotating groove 225 and finally hooks to a top surface of the rotating groove 225.

When the first hook 231b hooks to the top surface of the rotating groove 225, a thickness of the first hook 231b may be less than or equal to a depth of the rotating groove 225. When assembling the ceiling 220 and the chamber lid 210, the bottom surface of the first hook 231b is at the same level as the bottom surface of the ceiling 220, or is at a higher level than the bottom surface of the ceiling 220. In either case, the first hook 231b does not protrude from the bottom surface of the ceiling 220.

In the embodiment, the ceiling 220 may include a plurality of pads 224 embedded on a top surface of the ceiling 220 and disposed corresponding to the rotating grooves 225. In the embodiment, the pad 224 is disposed surrounding the corresponding opening 222. Accordingly, when the driving part 240 fastens the ceiling 220 toward the bottom surface of the chamber lid 210, a top surface of the pad 224 is in contact with the bottom surface of the chamber lid 210, thereby resulting in a gap between the ceiling 220 and the chamber lid 210.

According to design practice or process requirement, a proper thickness of the pad 224 may be chosen such that the top surface of the pad 224 may be at the same level as the top surface of the ceiling 220, or at a higher level than the top surface of the ceiling 220. The pads 224 and the ceiling 220 may be manufactured integrally or separately. In a case that the top surface of the pad 224 is at a higher level than the top surface of the ceiling 220, a spacing between the top surface of the pad 224 and the top surface of the ceiling 220 may be 0.1-0.3 mm or a proper value according to process conditions or reactant gases. For example, in an arsenic phosphide (AsP) process, a spacing between the top surface of the pad 224 and the top surface of the ceiling 220 may be approximately 0.3 mm such that the spacing between the top surface of the ceiling 220 and the bottom surface of the chamber lid 210 may be maintained at 0.3 mm in the process. In a nitride process, a spacing between the top surface of the pad 224 and the top surface of the ceiling 220 may be approximately 0.1 mm such that the spacing between the top surface of the ceiling 220 and the bottom surface of the chamber lid 210 may be maintained at 0.1 mm in the process.

In one exemplary, but not limiting, embodiment, the assembling device 200 may include four first suspension elements 231, four corresponding openings 222 and four corresponding pads 224. In general, at least two first suspension elements 231, at least two corresponding openings 222 and at least two corresponding pads 224 may be disposed in a balance manner such that the ceiling 220 would not shift laterally or rotate during elevation.

Figure 2D:
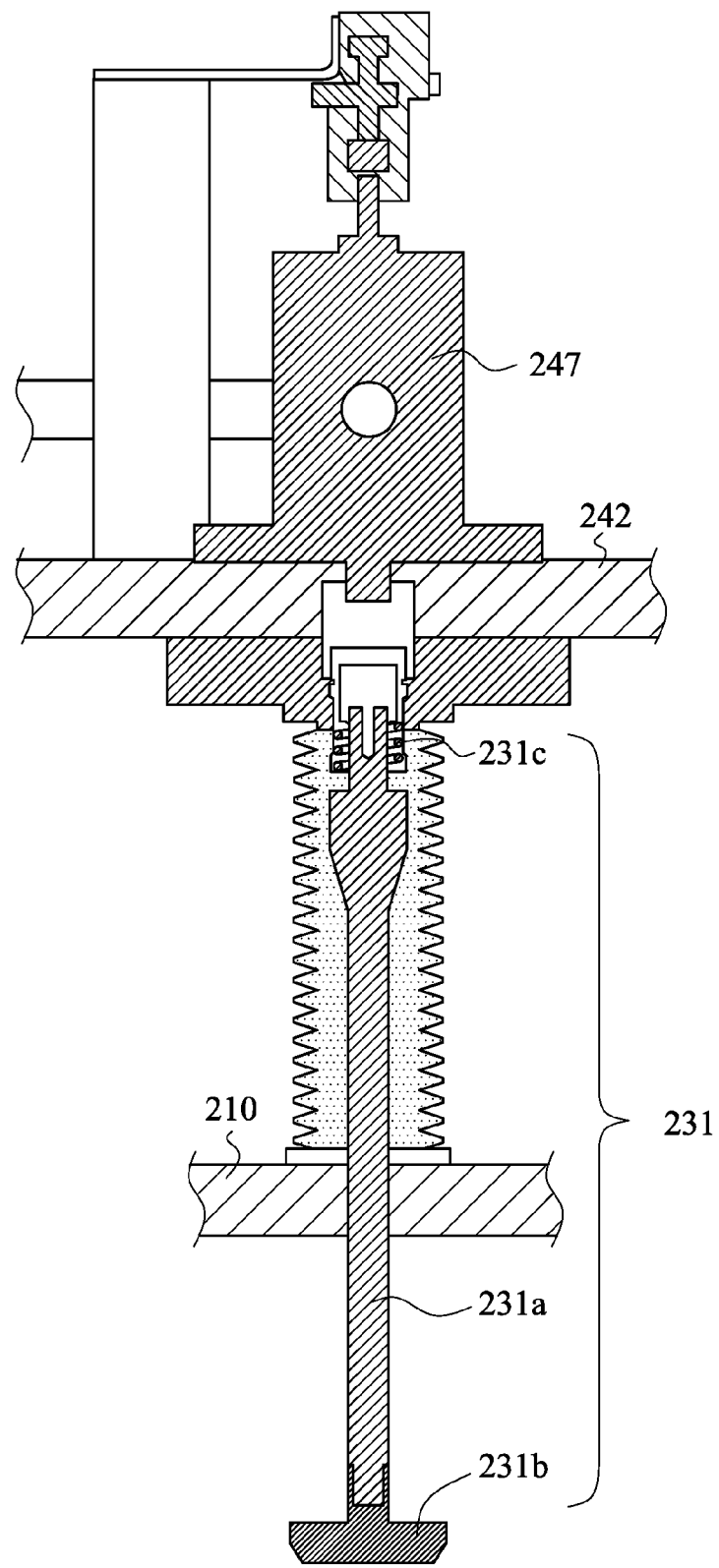
FIG. 2D shows a partial cross-sectional view of the suspension part according to another embodiment of the present invention.

FIG. 2D shows a partial cross-sectional view of the suspension part 230 according to another embodiment of the present invention. Each first suspension element 231 may further include a first buffer component 231c disposed at a top end of the first support rod 231a. When the driving part 240 drives the first support rod 231a and the first hook 231b to raise the ceiling 220 and fastens it to the bottom surface of the chamber lid 210, the first buffer component 231c may substantially reduce the force impacting on the ceiling 220 caused by the first hook 231b, thereby preventing the ceiling 220 from breaking. In one embodiment, the first buffer component 231c may include a spring.

Figure 2E:
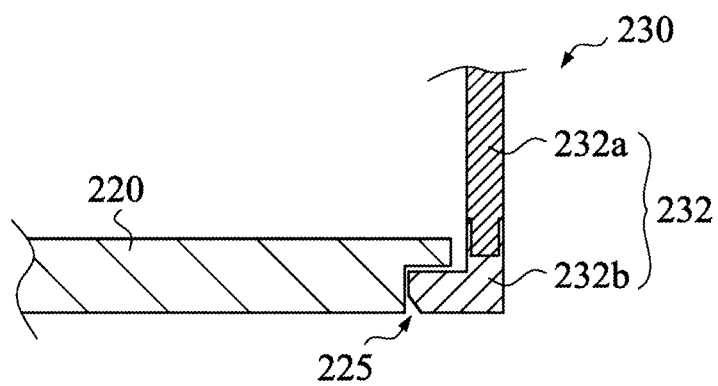
FIG. 2E shows a partial cross-sectional view of the ceiling and the suspension part according to another embodiment of the present invention.

FIG. 2E shows a partial cross-sectional view of the ceiling 220 and a second suspension element 232 of the suspension part 230 according to another embodiment of the present invention. The suspension part 230 may include a plurality of second suspension elements 232. Each second suspension element 232 may include a second support rod 232a and a second hook 232b, which as a whole are L-shaped. The second hook 232b is disposed at a bottom end of the second support rod 232a, and the second hook 232b faces toward the ceiling 220. Accordingly, the driving part 240 drives to lower and rotate the second suspension element 232 of the suspension part 230, and to hook it to an edge of the ceiling 220. Therefore, the ceiling 220 may then be raised and fastened to the bottom surface of the chamber lid 210. The edge of the ceiling 220 may have a rotating groove 225. When the elevating unit 241 lowers the second support rod 232a to the ceiling 220, the rotating unit 246 rotates the second support rod 232a, the second hook 232b accordingly rotates in the rotating groove 225 and finally hooks to a top surface of the rotating groove 225, thereby not affecting the reaction zone. Each second suspension element 232 may further include a second buffer component disposed at a top end of the second support rod 232a. When the ceiling 200 is raised and fastened to the bottom surface of the chamber lid 210, the second buffer component may substantially reduce the force impacting on the ceiling 220 caused by the second hook 232b. The suspension part 230 of the embodiment may selectively include the first suspension element 231 or the second suspension element 232 or their combination.

Figure 2F:
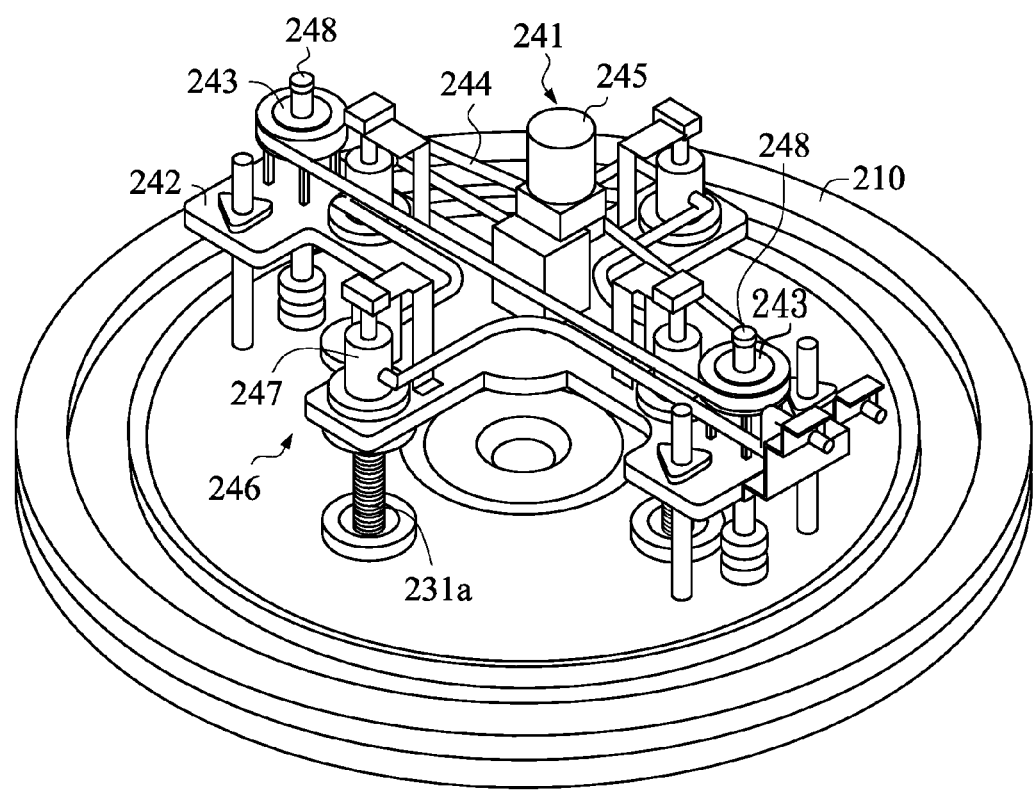
FIG. 2F shows a perspective view of the driving part of the assembling device of FIGS. 2A-2B.

FIG. 2F shows a perspective view of the driving part 240 of the assembling device 200 of FIGS. 2A-2B. The elevating unit 241 is configured to elevate the first suspension element 231. The elevating unit 241 may include an elevating plate 242, at least two belt pulleys 243, a drive belt 244 and a drive motor 245. The elevating plate 242 is disposed above the chamber lid 210, and is connected to a top end of the first support rod 231a of the first suspension element 231. Specifically, the first support rod 231a is inserted through the chamber lid 210, and is elevated along with the elevating plate 242. The belt pulleys 243 are symmetrically disposed on the elevating plate 242. In one embodiment, a center shaft 248 of the belt pulley 243 is connected to the elevating plate 242, and a bottom end of the center shaft 248 is inserted and screwed to the chamber lid 210. The drive belt 244 is looped over two belt pulleys 243. The drive motor 245 is disposed on the elevating plate 242, and is configured to elevate (i.e., raise or lower) the elevating plate 242 and the first support rod 231a by driving the belt pulleys 243 via the drive belt 244.

The rotating unit 246 may include at least three pneumatic cylinders 247, each of which is correspondingly disposed at a top end of the first support rod 231a, and is configured to rotate the first support rod 231a and the first hook 231b. Although the first suspension element 231 is exemplified in the embodiment as described above, the first suspension element 231 may, however, be substituted or accompanied with the second suspension 232 in other embodiments.

Figure 3A:
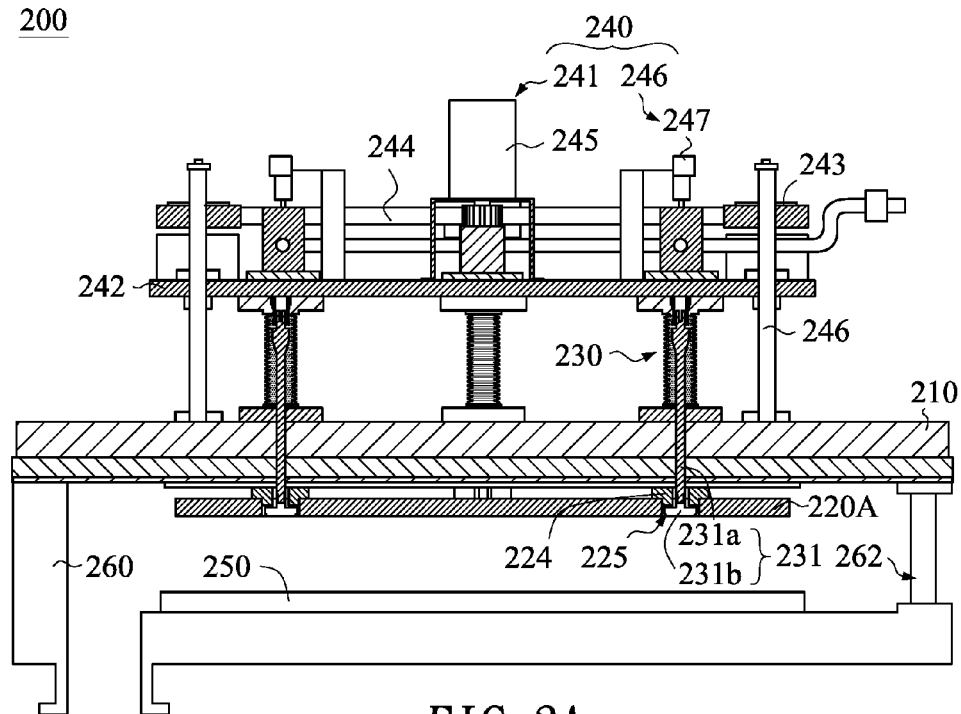
FIG. 3A and FIG. 3B show cross-sectional views of the assembling device adaptable to semiconductor equipment for unloading the ceiling according to another embodiment of the present invention.
Figure 3B:
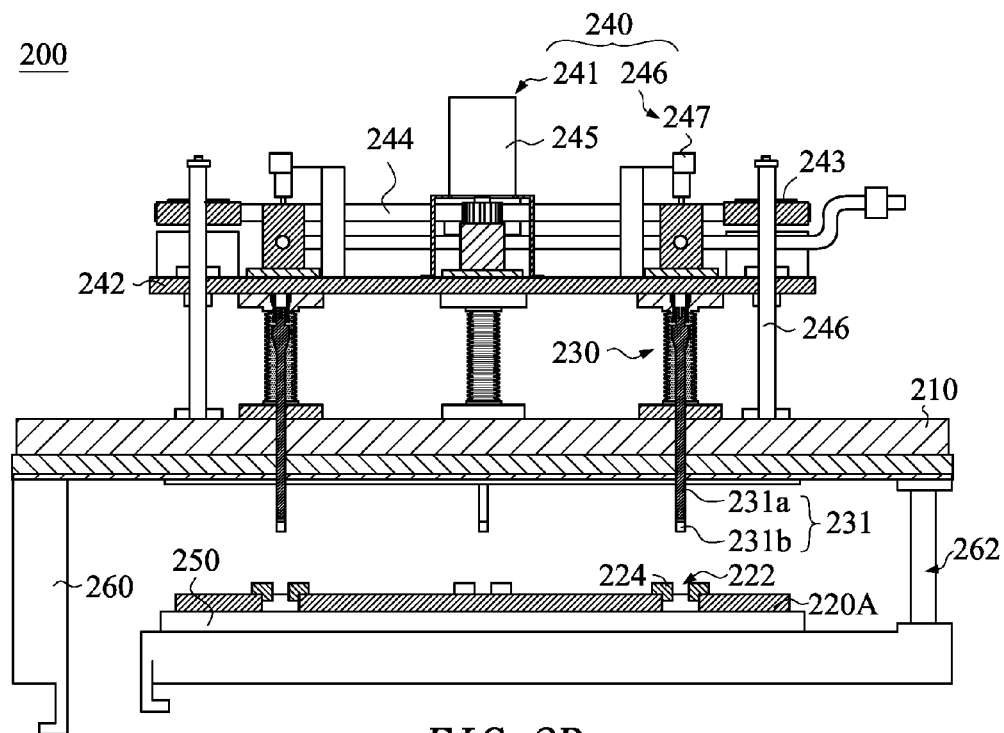

FIG. 3A and FIG. 3B show cross-sectional views of the assembling device 200 adaptable to semiconductor equipment for unloading the ceiling 220 according to another embodiment of the present invention. The driving part 240 drives the suspension part 230 to separate the ceiling 220 from the chamber lid 210. Specifically, the elevating unit 241 drives the belt pulleys 243 via the drive motor 245 and the drive belt 244 to lower the elevating plate 242. The first support rod 231a is thus lowered, and the ceiling 210 is separated from the chamber lid 210 until the ceiling 210 rests on a top surface of a susceptor 250. Subsequently, the pneumatic cylinder 247 of the rotating unit 246 rotates the first support rod 231a, and the first hook 231b then rotates out of the rotating groove 225 corresponding to the opening 222. The drive motor 245 of the elevating unit 241 then raises the first support rod 231a, and the first hook 231b therefore gets away from the opening 222.

Figure 3C:
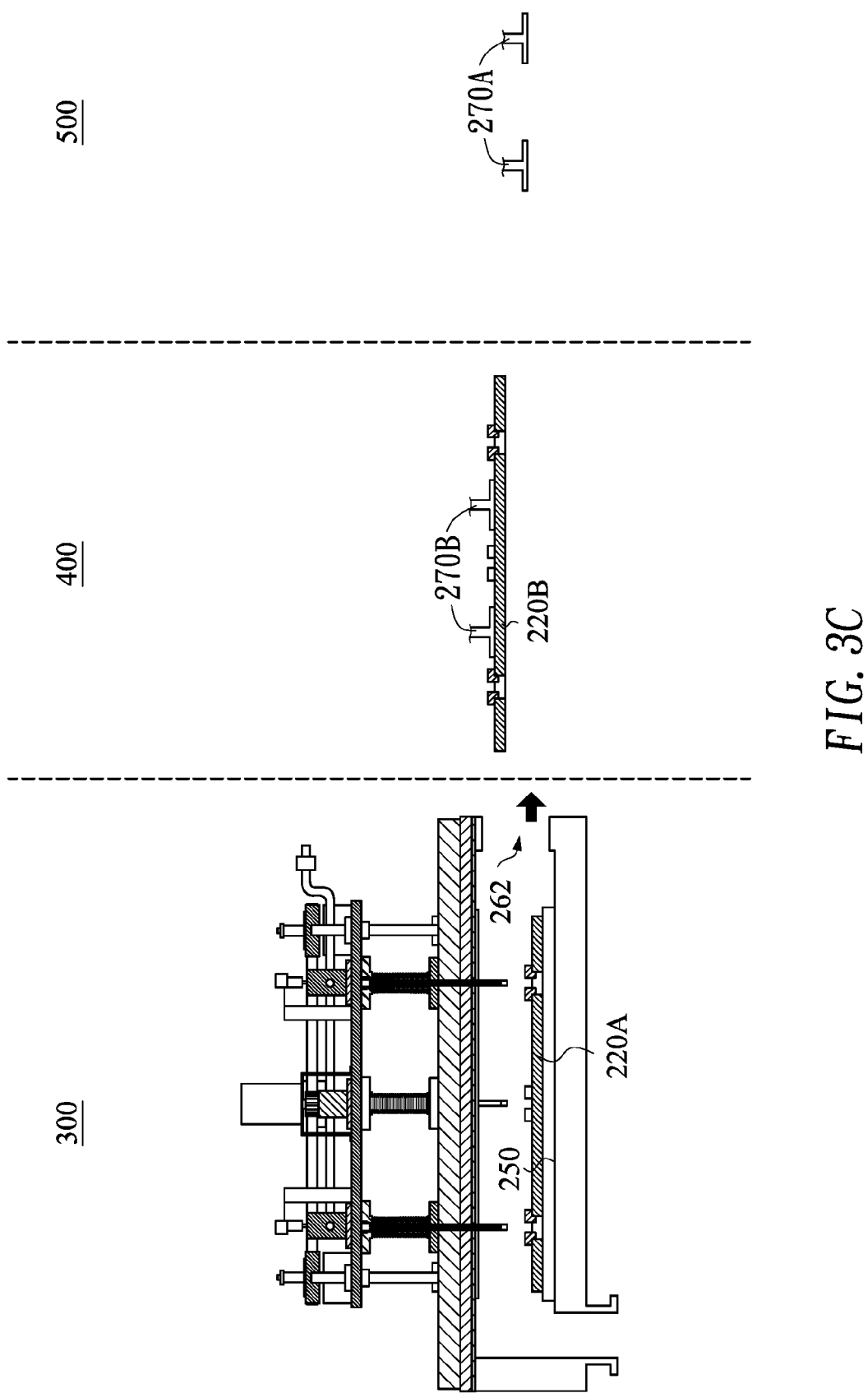

FIG. 3C and FIG. 3D show cross-sectional views of the assembling device 200 adaptable to semiconductor equipment for automatically replacing the ceiling according to another embodiment of the present invention. As shown in the figures, the assembling device 200 is disposed in a reaction zone 300, where the chamber lid 210 is disposed at the top of a chamber 260. The assembling device 200 may further include a first robot 270A and a second robot 270B. The chamber 260 may have a gate valve 262. After the process in the chamber 260 finishes, the ceiling 220A is unloaded onto the susceptor 250, and the ceiling 220A is transferred out of the reaction zone 300 through opened gate valve 262 by the first robot 270A and is then disposed in a place zone 500 for cleaning. Subsequently, another ceiling 220B disposed in a standby zone 400 is transferred to the susceptor 250 in the chamber 260 by the second robot 270B. The ceiling 220B is then fastened to the chamber lid 210 by the suspension part 230, followed by closing the gate valve 262, and the chamber 260 is ready for performing another process. Accordingly, the ceiling may be automatically transferred and replaced, thereby effectively reducing manpower and saving time in cooling the chamber 260. Although the first suspension element 231 is exemplified in the embodiment regarding FIGS. 3A-3D, the first suspension element 231 may, however, be substituted or accompanied with the second suspension 232 in other embodiments.

Figure 4:
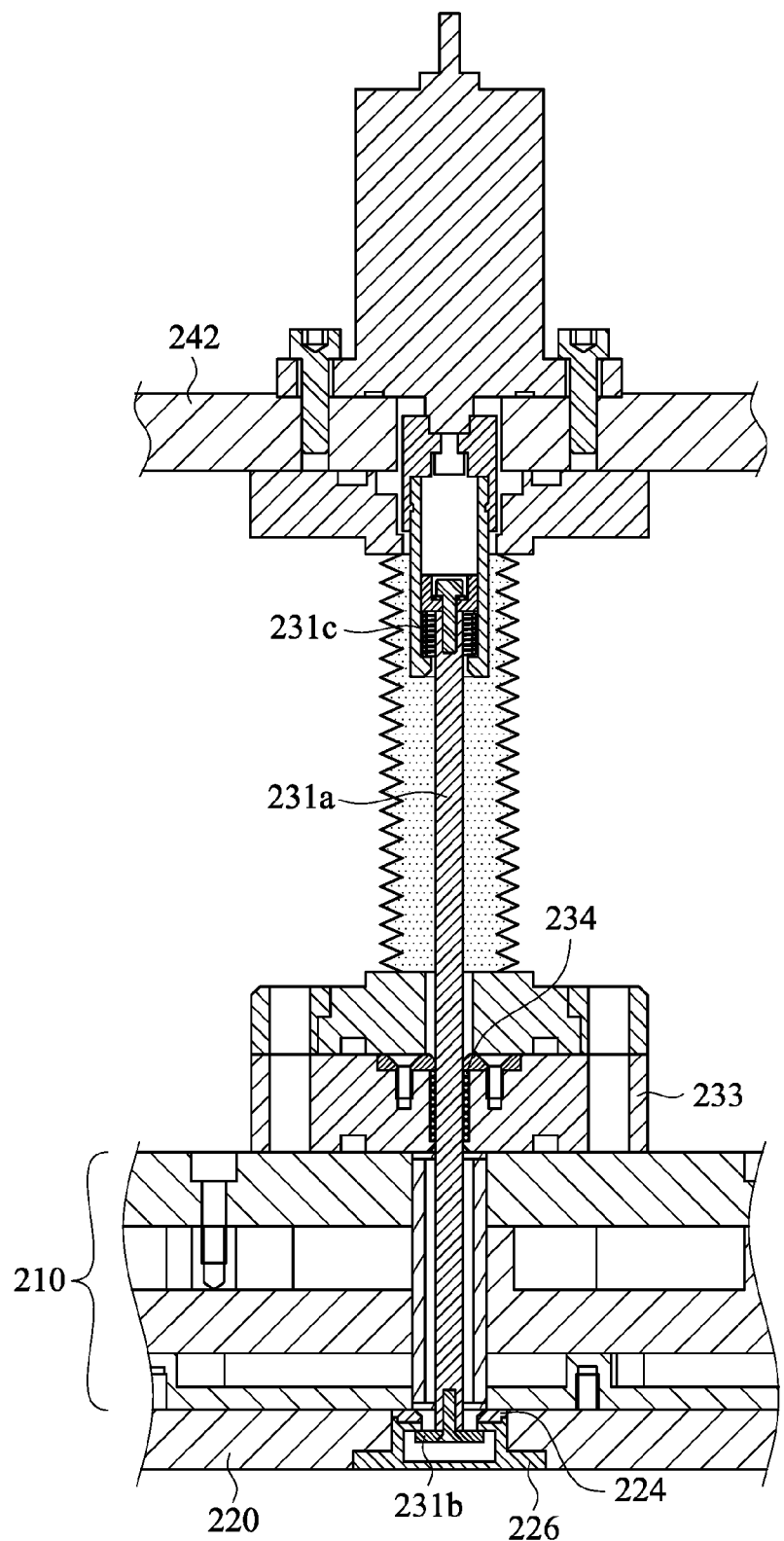
FIG. 4 shows a partial cross-sectional view of an assembling device adaptable to semiconductor equipment for assembling a ceiling and a chamber lid according to a further embodiment of the present invention.

FIG. 4 shows a partial cross-sectional view of an assembling device 200 adaptable to semiconductor equipment for assembling a ceiling 220 and a chamber lid 210 according to a further embodiment of the present invention. Components of the present embodiment being the same as or similar to the preceding embodiments are denoted with the same numerals, and details of the components are omitted for brevity. Aspects of the present embodiment that are distinct from the preceding embodiments will be elaborated in the following paragraphs.

In the embodiment, the suspension part 230 may include a plurality (e.g., four) of (first) suspension elements 231, each of which may include a (first) support rod (or bar) 231a and a (first) hook 231b. The hook 231b is a T-shaped hook with a top end connected to a bottom end of the support rod 231a. The embodiment may further include a constraint plate 233 attached to a top surface of the chamber lid 210. The constraint plate 233 has a through hole, through which the support rod 231a inserts.

Figure 5:
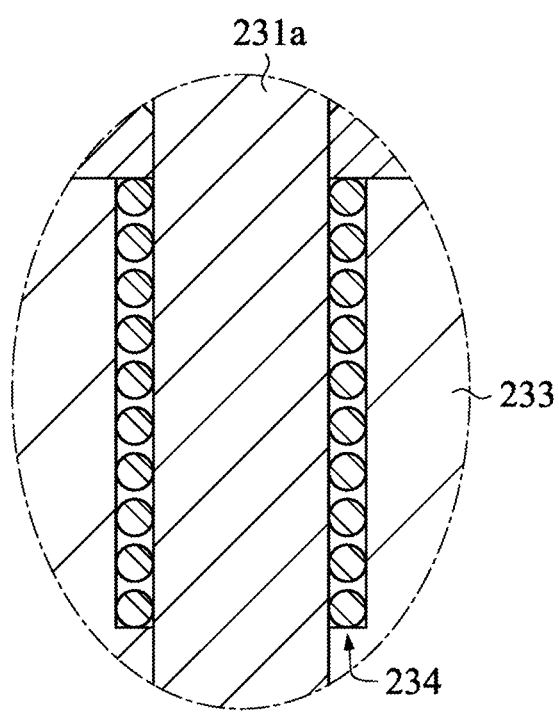
FIG. 5 shows a partial enlarged cross-sectional view of the constraint plate of FIG. 4.

According to a first aspect of the embodiment, a (slide) bearing 234, such as a ring-shaped ball bearing, is disposed on a sidewall of the through hole of the constraint plate 233. FIG. 5 shows a partial enlarged cross-sectional view of the constraint plate 233 of FIG. 4. The bearing 234 of the embodiment is configured to reduce friction between the support rod 231a and the constraint plate 233. Moreover, the bearing 234 can provide for stable linear movement of the support rod 231a and/or stable rotation of the support rod 231a.

According to a second aspect of the embodiment, as shown in FIG. 4, the support rod 231a may be a straight rod, which has a constant diameter throughout the rod. In contrast, the support rod 231a as exemplified in FIG. 2D of the preceding embodiment is a tapering rod, which has decreased diameter from the top down.

Figure 6A:
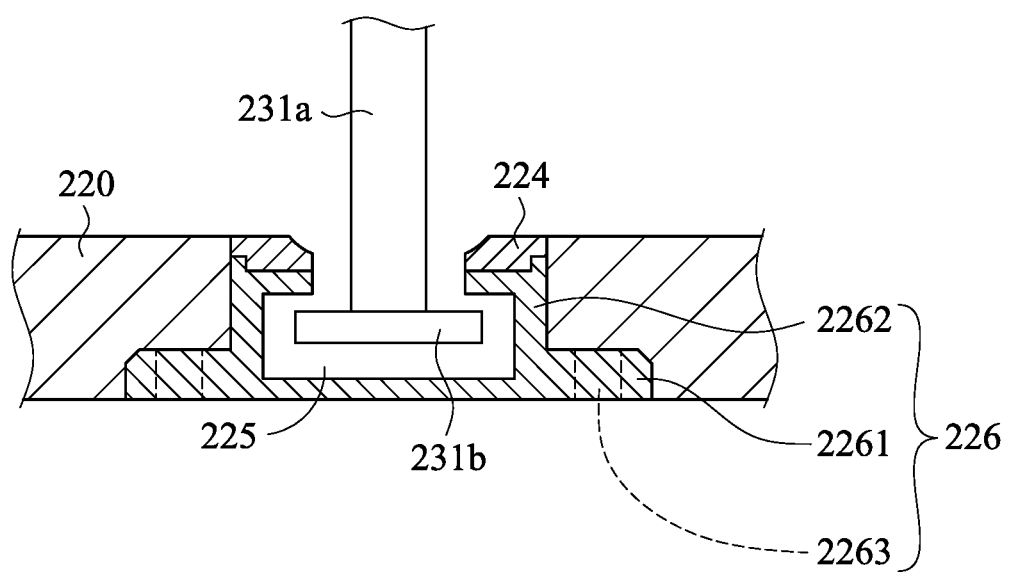
FIG. 6A shows a partial enlarged cross-sectional view of the ceiling of FIG. 4.
Figure 6B:
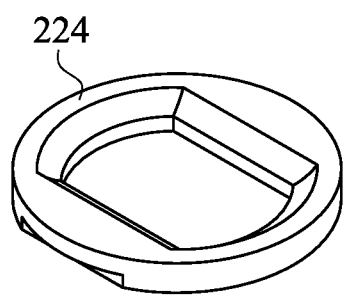
FIG. 6B shows a perspective view of the pad of FIG. 6A.
Figure 6C:
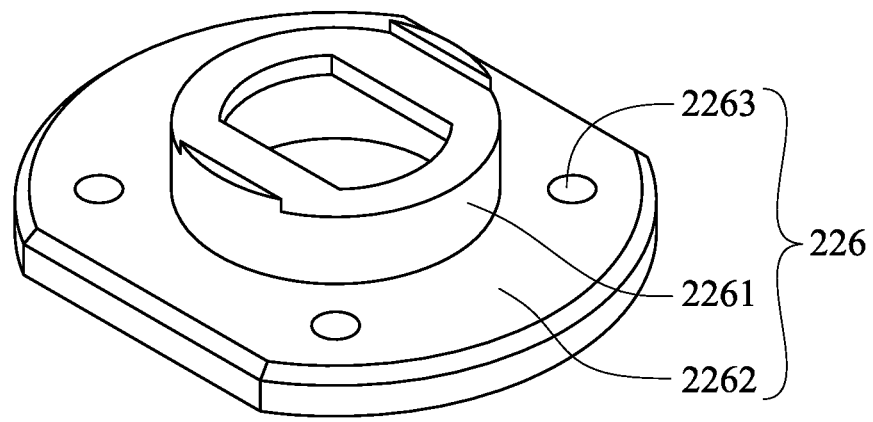
FIG. 6C shows a perspective view of the base of FIG. 6A.

FIG. 6A shows a partial enlarged cross-sectional view of the ceiling 220 of FIG. 4. The ceiling 220 of the embodiment may include a plurality of ring-shaped pads 224 embedded on, and protruding from, a top surface of the ceiling 220 and disposed corresponding to the rotating grooves 225, respectively. FIG. 6B shows a perspective view of the pad 224 of FIG. 6A. The ceiling 220 of the embodiment may further include a plurality of bases 226 correspondingly disposed below the pads 224, respectively. The base 226 may include a hollow cylinder 2261 that defines empty space of the rotating groove 225, and have a plate 2262 disposed below and connected to the hollow cylinder 2261. A bottom surface of the plate 2262 of the base 226 is substantially level with a bottom surface of the ceiling 220. FIG. 6C shows a perspective view of the base 226 of FIG. 6A. In the embodiment, the pad 224 may be made of heat insulation material such as quartz or ceramics, and the base 226 may be made of heat resistant material such as Molybdenum (or Moly).

The pad 224 and the base 226 together constitute a receptacle, into which the hook 231b is configured to insert, thereby attaching the hook 231b to the receptacle 224/226. In contrast, the receptacle as exemplified in FIG. 2A and FIG. 2C of the preceding embodiment is composed of only the pad 224. According to a third aspect of the embodiment, the rotating groove 225 defined by the receptacle (that is, the pad 224 and the associated base 226) is open at the top, and is closed at the bottom. Accordingly, reactant gasses for a process taking place below the ceiling 220 in a chamber (or reactor) will not leak into the ceiling 220 and will not deposit particles on the hook 231b. In contrast, the rotating groove 225 as exemplified in FIG. 2A of the preceding embodiment is open at both the top and the bottom. A thickness of the hook 231b of the embodiment may be substantially less than a depth of the rotating groove 225. For example, the thickness of the hook 231b is less than half the depth of the rotating groove 225. In contrast, the thickness of the hook 231b as exemplified in FIG. 2B of the preceding embodiment is substantially the same as the depth of the rotating groove 225.

Still referring to FIG. 6A, the base 226 has an upward step (or the first step) formed on (an edge of) a top surface of the base 226, while the pad 224 has a downward step (or the second step), that is complementary to the upward step, formed on (an edge of) a bottom surface of the pad 224. Therefore, the pad 224 can be firmly attached to the base 226 without unwanted translation and rotation. In another embodiment, the base 226 has a downward step formed on (an edge of) a top surface of the base 226, while the pad 224 has an upward step, that is complementary to the downward step, formed on (an edge of) a bottom surface of the pad 224. The plate 2262 of the base 226 may have a plurality of threaded holes 2263, through which the plate 2262, and thus the base 226 may be fastened to the ceiling 220 by means of screws.

After the ceiling 220 is transferred into a chamber by a robot, for example, via a gate valve, the suspension element 231 (that is, the support rod 231a and the hook 231b ) is then lowered such that the hooks 231b may be respectively attached to the receptacles (that is, the pads 224 and the bases 226). In theory, all the receptacles may be respectively attached (or hooked) to the hooks 231b at the same time provided that the receptacles 224/226 are at the same level. In practice, due to gravity of the ceiling 220 exerted on one end of the robot that is pivoted at another end, the receptacles 224/226 nevertheless are not at the same level, but are tilted. FIG. 7A and FIG. 7B show simplified cross-sectional views illustrated of tilted receptacles 224/226 and corresponding suspension elements (that is, the support rods 231a and the hooks 231b ) of FIG. 4. In the example, a robot (not shown) is pivoted at far right such that the left-hand receptacle 224/226 is at a level lower than the right-hand receptacle 224/226. It is observed that, in FIG. 7A, the right-hand hook 231b reaches the top surface of the plate 2262 of the base 226, while the left-hand hook 231b merely touches the top surface of the pad 224. Later on, as shown in FIG. 7B, when the left-hand hook 231b is attached to the pad 224, it is observed that the right-hand hook 231b and the left-hand hook 231b have a level difference denoted by d.

Figure 8A:
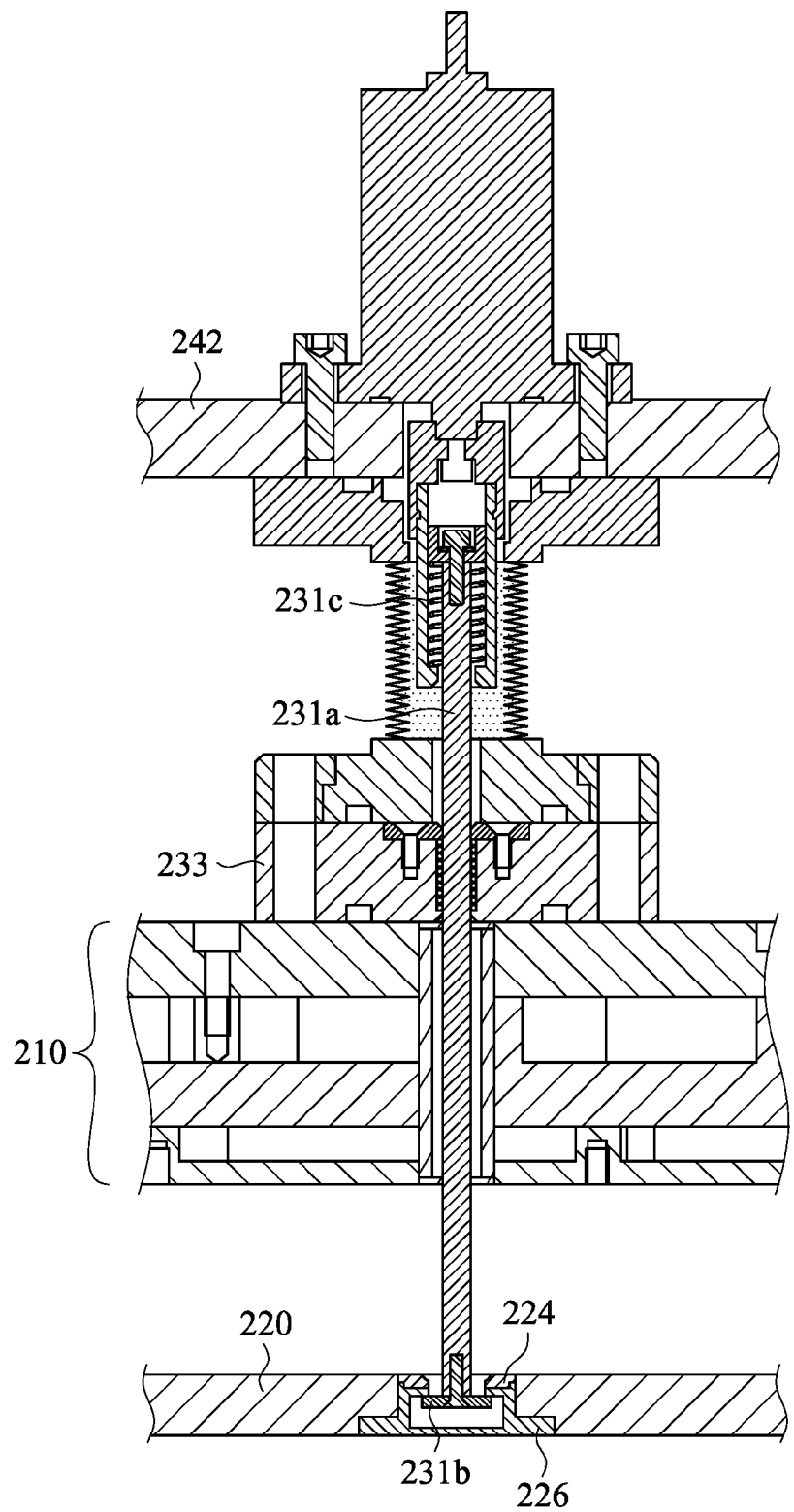
FIG. 8A to FIG. 8C show partial cross-sectional views of the assembling device of FIG. 4.
Figure 8B:
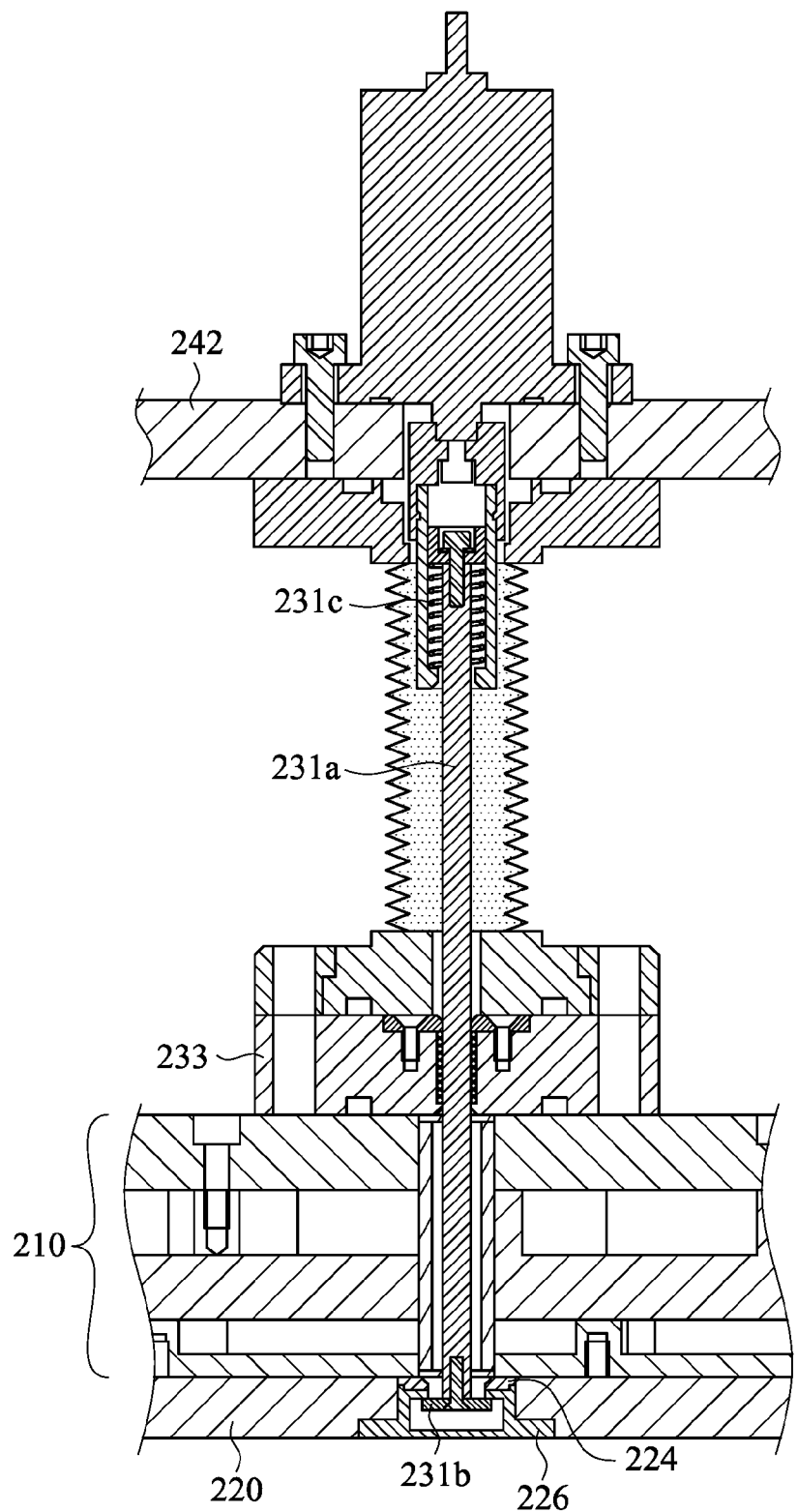
Figure 8C:
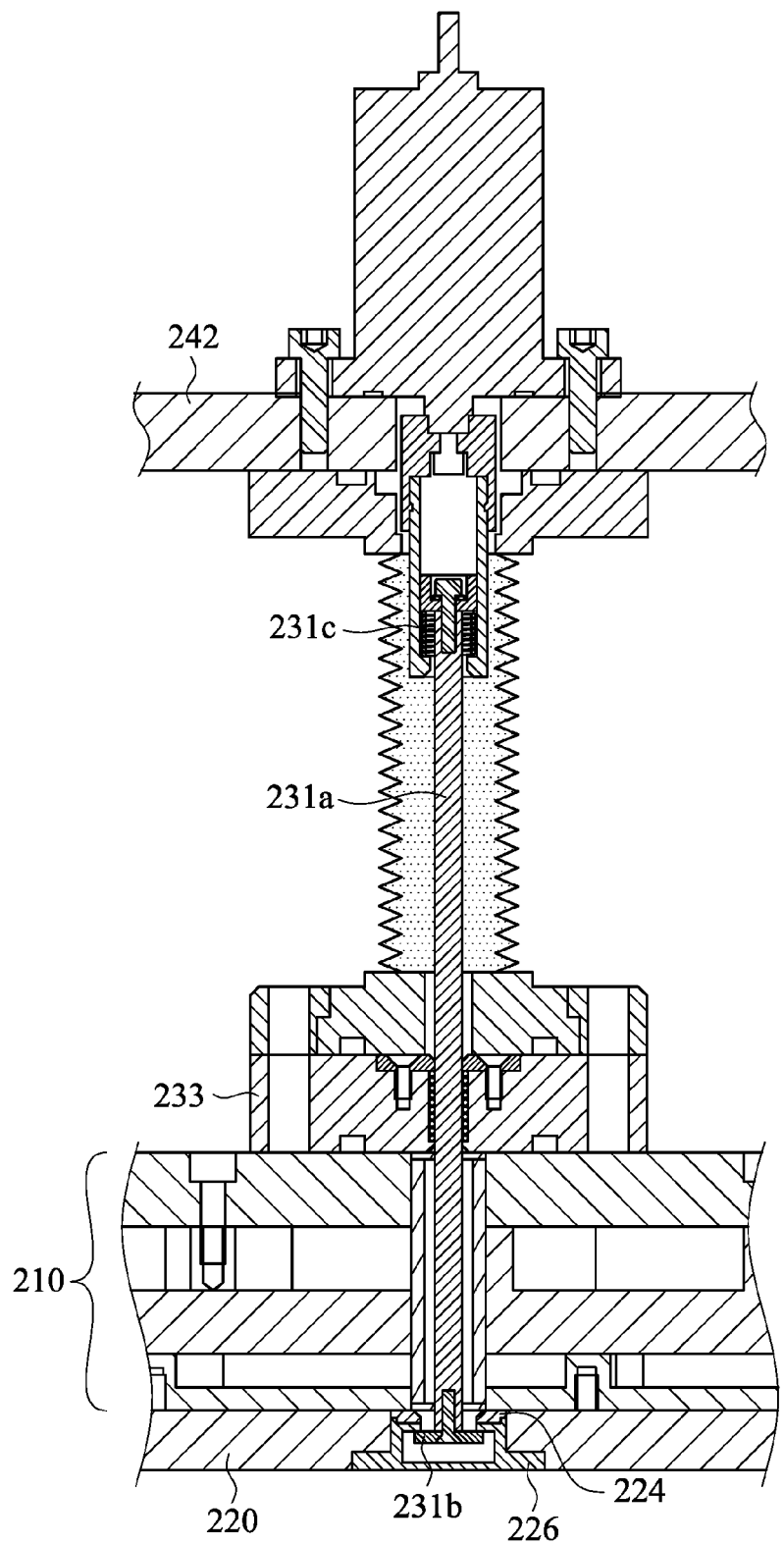

FIG. 8A to FIG. 8C show partial cross-sectional views of the assembling device 200 of FIG. 4 illustrated of successive motion of the suspension element 231 with respect to the receptacle 224/226. The suspension element 231 may further include a (first) buffer component 231c, such as a spring, disposed at a top end of the support rod 231a. According to a fourth aspect of the embodiment, the spring 231c is not compressed at the beginning.

That is, the spring 231c is initially at a resting position before raising the ceiling 220. In contrast, the spring 231c as exemplified in FIG. 2D of the preceding embodiment is compressed at the beginning with a pre-compression force being equal to or greater than the weight of the ceiling 220. Moreover, in the embodiment, there is empty space above a top end of the support rod 231a, but below the elevating plate 242 of the driving part 240, at the beginning before raising the ceiling 220. This empty space allows the support rod 231a to be pushed upwards by the (right-hand) plate 2262 of the base 226, as exemplified in FIG. 7B, without crushing the ceiling 220 or the robot.

Specifically, in FIG. 8A, the suspension element 231 is lowered such that the hook 231b is just attached to the receptacle 224/226. At that time, the spring 231c is still not compressed. In FIG. 8B, the ceiling 220 is raised by the suspension element 231 until the ceiling 220 is fastened to a bottom surface of the chamber lid 210. During the period of raising the ceiling 220, the weight of the ceiling 220 causes the spring 231c compressed. In FIG. 8C, the suspension element 231 continues pulls the ceiling 220 upwards, and the spring 231c is continuously compressed until a predetermined position has been reached.

Although specific embodiments have been illustrated and described, it will be appreciated by those skilled in the art that various modifications may be made without departing from the scope of the present invention, which is intended to be limited solely by the appended claims.

What is claimed is:

1. An assembling device used for semiconductor equipment, comprising:
   a chamber lid;
   a ceiling disposed below the chamber lid;
   a suspension part inserted through the chamber lid and to be hooked to the ceiling;
   a driving part disposed above the chamber lid and connected to the suspension part, the driving part being configured to drive the suspension part to join or separate the ceiling and the chamber lid; and
   a plurality of receptacles disposed in the ceiling and configured to be correspondingly attached to the suspension part, each of the receptacles defines a rotating groove that is open at top and closed at bottom.

2. The device of claim 1, wherein the suspension part comprises a plurality of suspension elements disposed above the ceiling, each of the suspension elements comprises:

a support rod; and a hook disposed at a bottom end of the support rod.

3. The device of claim 2, wherein the hook is T-shaped.

4. The device of claim 2, further comprising:

a constraint plate attached to a top surface of the chamber lid, the constraint plate having a through hole through which the support rod inserts; and a bearing disposed on a sidewall of the through hole.

5. The device of claim 4, wherein the bearing comprises a ball bearing.

6. The device of claim 2, wherein the support rod comprises a straight rod, which has a constant diameter throughout the support rod.

7. The device of claim 1, wherein the receptacle comprises:

a pad embedded on, and protruding from, a top surface of the ceiling and disposed corresponding to the rotating groove; and a base disposed below the pad.

8. The device of claim 7, wherein the base comprises:

a hollow cylinder that defines empty space of the rotating groove; and a plate disposed below and connected to the hollow cylinder.

9. The device of claim 8, wherein the plate has a plurality of threaded holes, through which the plate is fastened to the ceiling by screws.

10. The device of claim 8, wherein a bottom surface of the plate is substantially level with a bottom surface of the ceiling.

11. The device of claim 7, wherein the pad comprises heat insulation material, and the base comprises heat resistant material.

12. The device of claim 11, wherein the heat insulation material comprises quartz or ceramics, and the heat resistant material comprises Molybdenum.

13. The device of claim 7, wherein the base has a first step formed on a top surface of the base, and the pad has a second step, that is complementary to the first step, formed on a bottom surface of the pad.

14. The device of claim 2, wherein a thickness of the hook is substantially less than a depth of the rotating groove.

15. The device of claim 2, wherein the suspension element comprises a buffer component disposed at a top end of the support rod, and there is empty space above the top end of the support rod before raising the ceiling.

16. The device of claim 15, wherein the buffer component comprises a spring, which is at a resting position before raising the ceiling.

17. The device of claim 2, wherein the driving part comprises: an elevating portion configured to elevate the suspension part;

and a rotating portion configured to rotate the suspension part.

18. The device of claim 17, wherein the elevating portion comprises: an elevating plate disposed above the chamber lid and connected to a top end of the support rod; at least two belt pulleys disposed on the elevating plate; a drive belt looped over the belt pulleys; and a drive motor disposed on the elevating plate, the drive motor being configured to elevate the elevating plate and the support rod by driving the belt pulleys via the drive belt.

19. The device of claim 18, wherein a center shaft of the belt pulley is connected to the elevating plate, and a bottom end of the center shaft is inserted and screwed to the chamber lid.

20. The device of claim 17, wherein the rotating portion comprises at least three pneumatic cylinders, each of which is correspondingly disposed at a top end of the support rod, and is configured to rotate the support rod.

* * * * *